United States Patent [19]

Wilhelm et al.

[11] 4,199,758
[45] Apr. 22, 1980

[54] SOLID STATE INDICATING APPARATUS

[75] Inventors: Donald F. Wilhelm; William J. Jones, Jr., both of Toledo, Ohio

[73] Assignee: Helm Instrument Co., Inc., Toledo, Ohio

[21] Appl. No.: 902,872

[22] Filed: May 4, 1978

[51] Int. Cl.² .............................................. G06K 15/18
[52] U.S. Cl. ..................................... 340/753; 340/782
[58] Field of Search ...................... 340/753, 754, 782; 324/96, 99 D

[56] References Cited

U.S. PATENT DOCUMENTS

| | | | |
|---|---|---|---|
| 2,497,961 | 2/1950 | Shaw | 324/99 D |
| 3,133,278 | 5/1964 | Millis | 340/347 |
| 3,383,594 | 5/1968 | Fiorletta et al. | 324/121 |
| 3,684,870 | 8/1972 | Nelson | 340/753 X |
| 3,766,474 | 10/1973 | MacDonald | 324/99 D |
| 3,772,874 | 11/1973 | Lefkowitz | 340/753 X |
| 3,796,951 | 3/1974 | Joseph | 324/122 |
| 3,927,571 | 12/1975 | Athey | 73/362 |
| 3,961,256 | 6/1976 | Gaskell et al. | 324/96 |
| 3,987,392 | 10/1976 | Kugelmann et al. | 324/96 |
| 4,004,220 | 1/1977 | Kerber et al. | 324/103 P |
| 4,006,412 | 2/1977 | Campbell et al. | 324/96 |

OTHER PUBLICATIONS

Popular Electronics; Mar. 1976, "An LED Readout Audio Power Meter;" Tim Henry; 4 pp.

Electronics; Mar. 17, 1977, "Analog Meter Has LED Display;" 2 pp.

*Primary Examiner*—David L. Trafton
*Attorney, Agent, or Firm*—Wilson, Fraser, Barker & Clemens

[57] ABSTRACT

An apparatus for indicating a quantity of electrical information in decimal notation. An input signal having a voltage level proportional to the quantity to be indicated is compared with a plurality of decimally related reference voltage levels to generate a separate decade enable signal for each reference voltage level which is equal to or less than the input signal voltage level. The input signal and the decade enable signals are utilized to generate a units signal having a voltage level proportional to the difference between the input signal voltage level and the voltage level of the largest reference voltage for which a decade enable signal has been generated. The units signal voltage level is compared with the reference voltage levels to generate a separate units enable signal for each of the reference voltage levels which are equal to or less than the units signal voltage level. The decade and units enable signals drive a display which typically includes a plurality of light emitting diodes for indicating the quantity of the electrical information. This display can have the decades indicating LEDs positioned in a semi-circle and the units indicating LEDs positioned in a straight line for improved readability.

16 Claims, 13 Drawing Figures

SOLID STATE INDICATING APPARATUS

BACKGROUND OF THE INVENTION.

1. Field of the Invention

The present invention concerns an apparatus for displaying sensed electrical information in general and to a solid state indicator for displaying electrical information to the nearest one percent in particular.

2. Description of the Prior Art

The two basic means for displaying electrical information are the electro-mechanical meter and the solid state display. In the electro-mechanical meter, the electrical energy is converted into the movement of a mechanical pointer across a meter face carrying indicia of the quantity being displayed. In the solid state display, an analog to digital conversion takes place to generate drive signals to activate segments of the display to form letters, numbers and symbols. These segments can be in the form of gas discharge tubes, liquid crystals, light emitting diodes, etc.

One form of prior art solid state display is a light bar comprised of a plurality of individual display segments arranged in a straight line. Each segment represents one predetermined portion of the total display, such as one percent. Each segment is driven from a comparator which compares the input signal level with a reference voltage from a voltage divider. Such a device has the disadvantages of being difficult to read from a distance and requiring a large number of segments for reasonable resolution.

SUMMARY OF THE INVENTION

The present invention concerns a solid state indicating apparatus which is easy to read and has a minimum number of individual indicators. The apparatus is responsive to an input signal for indicating a quantity of electrical information in decimal notation wherein the input signal has a voltage level which is proportional to the quantity to be indicated. A span reference ladder or voltage divider network is utilized to generate a plurality of decimally related reference voltage levels. The input signal voltage level is compared with the reference voltage levels to generate a separate decade enable signal for each one of the reference voltage levels which are equal to or less than the input signal voltage level. The input signal and the decade enable signals are utilized to generate a units signal having a voltage level proportional to the difference between the input signal voltage level and the voltage level of the largest reference voltage for which a decade enable signal has been generated. The units signal voltage level is compared with the reference voltage levels to generate a separate units enable signal for each one of the reference voltage levels which are equal to or less than the units signal voltage level.

A visual display typically includes a plurality of light emitting diodes each responsive to one of the decade enable signals or the units enable signals. The decade LEDs are arranged in a semi-circle in ascending order and the units LEDs are arranged in a straight line inside the semi-circle. THe units LEDs cycle between the lighting of adjacent decade LEDs as the input signal voltage level varies, with all LEDs at and below the indicated voltage level being turned on for ease of reading the quantity being indicated. Polarity indicators can also be included.

It is an object of the present invention to reduce the complexity of devices for indicating electrical information.

It is another object of the present invention to decrease the difficulty in reading visual indicators of the type employing individual indicators for portions of the quantity being indicated.

DESCRIPTION OF THE PREFERRED EMBODIMENT

Figure 1:
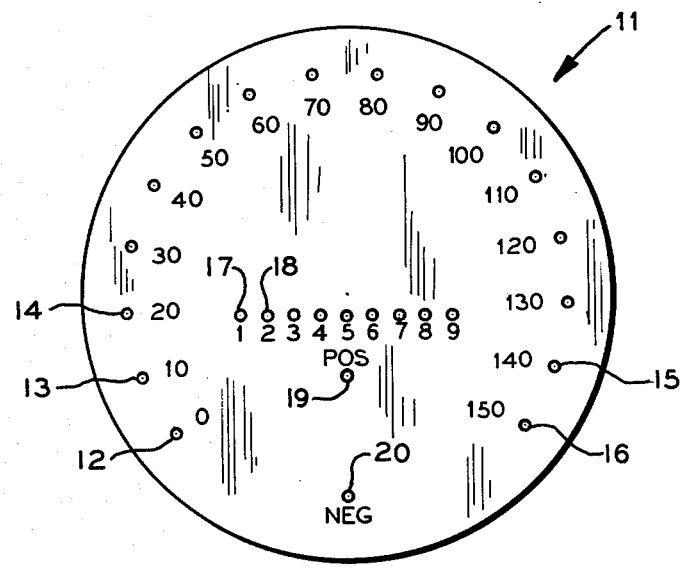
FIG. 1 is a view of a visual display according to the present invention.

There is shown in FIG. 1 a display means 11 according to the present invention for visually indicating a quantity of electrical information. A plurality of decade indicators are positioned along an arc of a circular path such as a zero indicator 12, a ten indicator 13, a twenty indicator 14, a one hundred forty indicator 15 and a one hundred fifty indicator 16. A plurality of units indicators are positioned along a straight line path inside the arc of decade indicators such as a one indicator 17 and a two indicator 18. If the quantity to be displayed can have either a positive or a negative polarity, a pair of polarity indicators are provided such as a positive polarity indicator 19 and a negative polarity indicator 20.

The quantity of electrical information to be indicated is represented as an input signal having a voltage level proportional to the quantity. The indicia adjacent the units and decades indicator can represent, for example, volts or amperes or percent of a standard reference quantity. The units and decades indicators representing the quantity will be lighted as will all the decades indicators representing voltage levels below the voltage level of the input signal. Thus, for an input signal voltage level of seventy-five, all decade indicators from zero through seventy will be lighted to define an arc and all units indicators from one through five will be lighted to define a straight line which arc and straight line are easily distinguishable even from a substantial distance as compared to the prior art linear displays.

Figure 2:
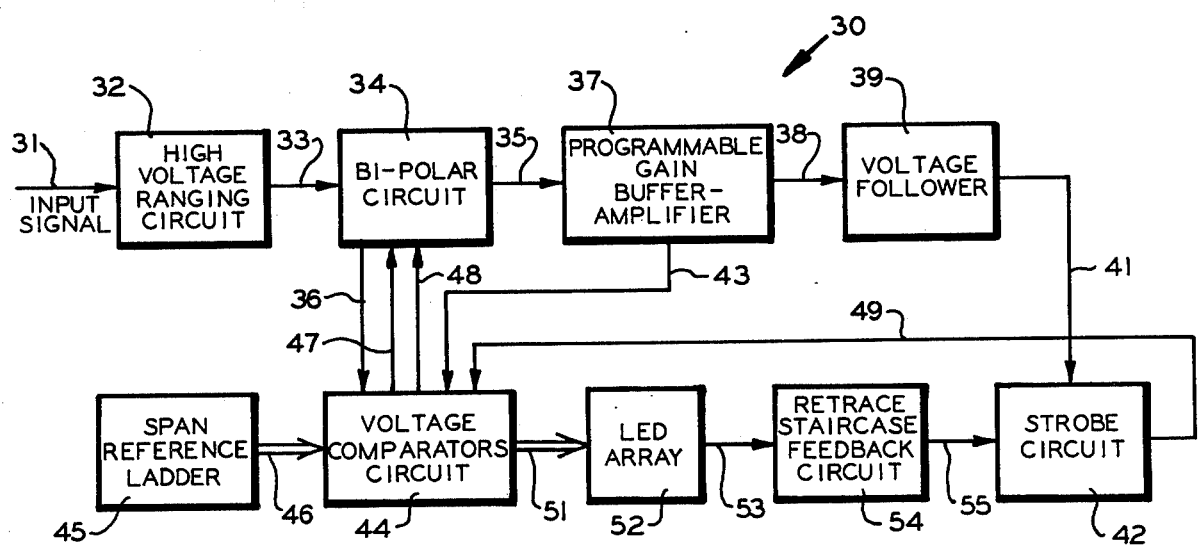
FIG. 2 is a block diagram of a circuit for generating a visual display of electrical information according to the present invention.

There is shown in FIG. 2 a block diagram of a circuit 30 according to the present invention for indicating a quantity of electrical information. The input signal having a voltage level proportional to the quantity is applied to the circuit on an input line 31 connected to a high voltage ranging circuit 32. The circuit 32 is utilized to scale the input signal to the proper level for comparisons with the reference voltages generated in the circuit. The scaled input signal is applied on a line 33 to a bi-polar circuit 34. The circuit 34 generates a signal representing the absolute value of the scaled input signal on a line 35 and a polarity control signal on a line 36. The line 35 is connected to a programmable gain buffer-amplifier 37 which has a selectively adjustable gain for increasing the voltage level of sub-standard input signals much as the high voltage ranging circuit 32 adjusts the voltage level of super-standard input signals. The buffer-amplifier 37 also provides high impedance isolation between the input to the circuit 30 and remainder of the circuit to prevent loading down of the input signal source.

The output signal from the buffer-amplifier 37 is split into two paths, one to the circuit for generating decade enable signals and one to the circuit for generating a units signal. The absolute value input signal is generated on a line 38 to a voltage follower 39 which buffers the signal and generates it on a line 41 to a strobe circuit 42. The absolute value input signal is also generated on a line 43 to a voltage comparators circuit 44. A span reference ladder or voltage divider 45 generates a plurality of reference voltage levels on a plurality of lines 46 to the circuit 44. The circuit 44 compares the voltage level of the input signal on the line 43 with each of the reference voltage levels and generates a decade enable signal for each reference voltage level which is equal to or the less than the input signal voltage level. The circuit 44 also responds to the polarity control signal on the line 36 to generate a positive polarity enable signal on line 47 or a negative polarity enable signal on a line 48 to the bi-polar circuit 34 to control the absolute value circuitry.

The voltage comparators circuit 44 also receives a units signal from the strobe circuit 42 on a line 49. The voltage level of the units signal is compared with the reference voltage levels to generate a units enable signal for each of the reference voltage levels which are equal to or less than the units signal voltage level. The circuit 44 generates the decade, units, positive polarity and negative polarity enable signals on a plurality of lines 51 to a display 52 which typically is an LED array as shown in FIG. 1. The decade enable signals are an output from the array 52 on a plurality of lines 53 to a retrace staircase feedback circuit 54. The circuit 54 generates a positive potential current, inversely proportional to the number of decade enable signals which are being generated, on a line 55. The positive potential current is summed in the strobe circuit with a negative potential current which two currents are equal for any input signal voltage level less than the ten decade reference voltage level. The absolute value input signal on the line 41 is also summed with the two currents to generate the units signal on the line 49. As the voltage level of the input signal increases, the voltage level of the units signal will increase until a decade is reached and the corresponding decade enable signal is generated to reduce the units signal voltage level to zero. Thus, the circuit 54 responds to the decade enable signals to "retrace" every decade such that the units signal cycles.

Figure 3:
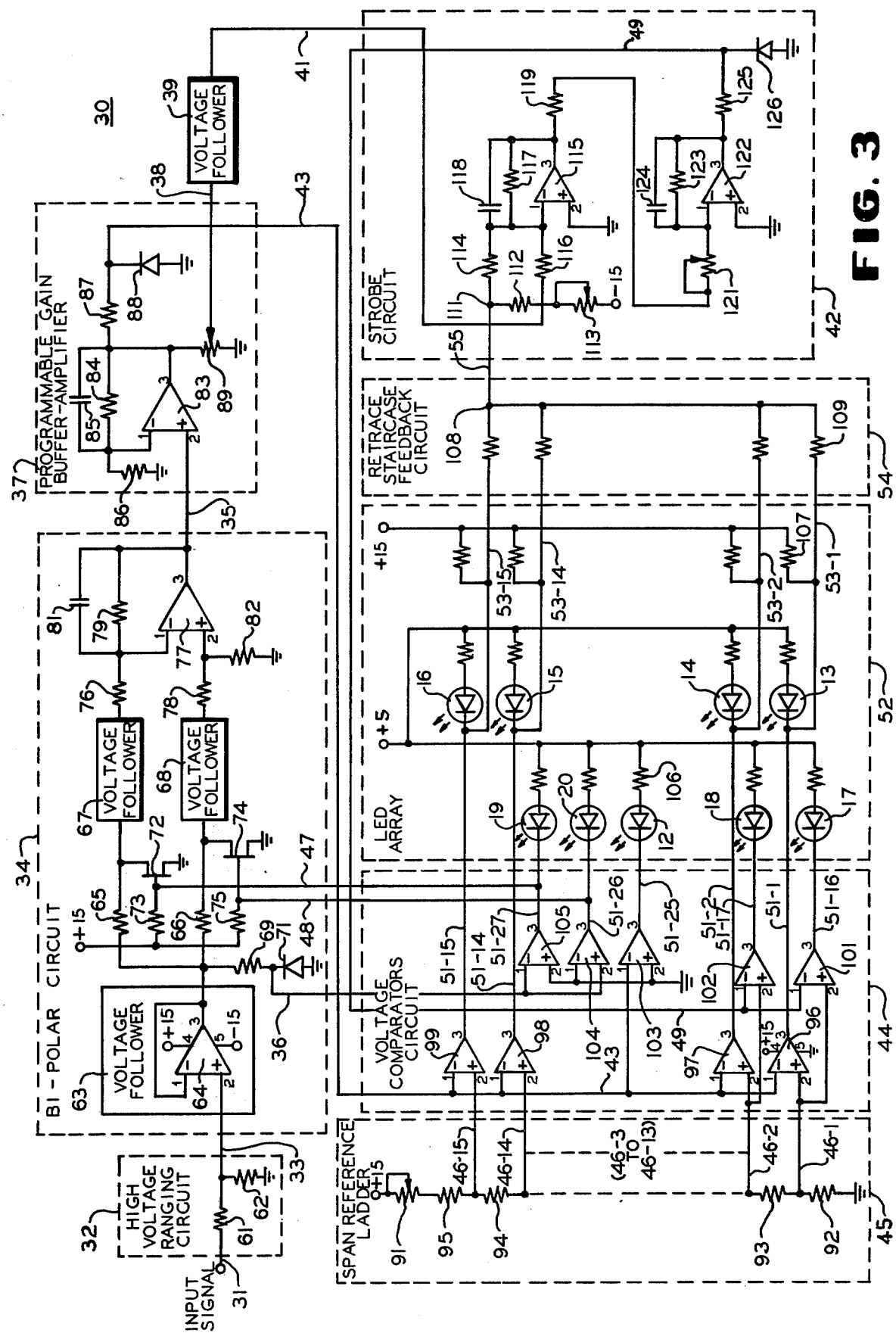
FIG. 3 is a schematic diagram of the circuit of FIG. 2.

There is shown in FIG. 3 a schematic diagram of the circuit 30 of FIG. 2 and a portion of the indicators of FIG. 1. The high voltage ranging circuit 32 is represented as a resistor 61 connected between the lines 31 and 33 and a resistor 62 connected between the line 33 and the ground potential of the circuit power supply (not shown). The resistors function as a voltage divider to scale the voltage level of a super-standard input signal to the required level for comparison with the reference voltages in the circuit 30. Although shown as fixed resistors, either one or both of the resistors 61 and 62 could be a potentiometer or could be one of at least two resistors connected for selective insertion in the circuit 32.

The scaled input signal on the line 33 is applied to a voltage follower 63 in the bi-polar circuit 34. The voltage follower comprises an operational amplifier 64 having a noninverting input 64-2 connected to the line 33 and an inverting input 64-1 connected to an output 64-3. A pair of power supply inputs 64-4 and 64-5 are connected to the positive potential and negative potential respectively of the circuit power supply (not shown). The positive and negative potentials are typically fifteen volts. The voltage follower has unity gain, high input impedance and low output impedance to function as an isolator between the input signal source (not shown) and the remainder of the circuit 30. The output 64-3 is connected through a pair of resistors 65 and 66 to a pair of voltage followers 67 and 68 respectively which are similar to the voltage follower 63. The output 64-3 is also connected to the line 36 through a resistor 69 to generate the polarity control signal to the voltage comparators circuit 44. A diode 71 has an anode connected to the circuit ground potential and a cathode connected to the line 36 to function as a clamp at one diode drop below the circuit ground potential.

A field effect transistor (FET) 72 has a drain connected to the input of the voltage follower 67, a source connected to the circuit ground potential and a gate connected to the positive potential power supply through a current limiting resistor 73. The FET 72 is a p-channel device wherein the positive potential at the gate turns it off to allow the scaled input signal from the voltage follower 63 to be generated at the output of the voltage follower 67. The gate is also connected to the positive polarity enable signal line 47. When the enable signal is generated on the line 47, the gate will be pulled down to the circuit ground potential to turn on the FET 72 which applies the ground potential to the input of the voltage follower 67 such that no output signal is generated. An FET 74 has a source connected to the input of the voltage follower 68, a drain connected to the circuit ground potential and a gate connected to the positive potential power supply through a current limiting resistor 75. The gate of the FET 74 is also connected to the line 48 to receive the negative polarity enable signal. The FET 74 and the voltage follower 68 function in a manner similar to the FET 72 and the voltage follower 67.

The output of the voltage follower 67 is connected through a resistor 76 to an inverting input 77-1 of an operational amplifier 77. The output of the voltage follower 68 is connected through a resistor 78 to a non-inverting input 77-2 of the amplifier 77. The input 77-1 is connected to an output 77-3 of the amplifier through a parallel combination of a feedback resistor 79 and a filter capacitor 81. The input 77-2 is connected to the circuit ground potential through a resistor 82. The values of the resistors 76, 78, 79 and 82 are equal such that the amplifier 77 has unity gain for both positive and negative polarity input signals and the negative polarity input signal is inverted at the output 77-3 such that an absolute value input signal is generated on the line 35 connected to the output 77-3.

The line 35 is connected to a non-inverting input 83-2 of an operational amplifier 83 in the programmable gain buffer-amplifier 37. The amplifier 83 has an inverting input 83-1 connected to an output 83-3 through a parallel connected feedback resistor 84 and filter capacitor 85. The input 83-1 is also connected to the circuit ground potential through a resistor 86. The values of the resistors 84 and 86 are selected to determine the gain required to increase the voltage level of sub-standard input signals for comparison with the reference voltage levels in the circuit 30. The output 83-3 is connected to the line 43 through a resistor 87 and the line 43 is clamped at one diode drop below the circuit ground potential by a diode 88 having an anode connected to the circuit ground potential and a cathode connected to the line 43. A potentiometer 89 is connected between the output 83-3 and the circuit ground potential and has a tap connected to the line 38.

The span reference ladder 45 includes a potentiometer 91 connected between the positive potential power supply and a plurality of resistors connected in series to generate the reference voltage levels. A resistor 92, a resistor 93, a plurality of resistors represented by a dashed line, a resistor 94 and a resistor 95 are connected in series between the potentiometer 91 and the circuit ground potential. If the series connected resistors are equal in value, each will have an equal amount of voltage dropped across it as determined by the setting of the tap of the potentiometer 91 which is connected to the positive potential power supply. Thus, the voltage across the resistor 92 will represent the ten decade, the voltage across the resistors 92 and 93 will represent the twenty decade and, using the display of FIG. 1 as an example, the voltage at the junction between the resistors 94 and 95 represents the one hundred fifty decade. The junction between adjacent resistors in the ladder is connected to a voltage comparator in the voltage comparators circuit 44 by one of the plurality of lines 46. For example, the junction between the resistors 92 and 93 is connected to the line 46-1, the junction between the resistor 93 and the adjacent resistor (not shown) is connected to the line 46-2, the junction between the resistor 94 and the adjacent resistor (not shown) is connected to the line 46-14 and the junction between the resistors 94 and 95 is connected to the line 46-15. The lines 46-3 through 46-13 are not shown in order to simplify the schematic.

The voltage comparators circuits 44 includes a plurality of differential comparators 96, 97, 98 and 99 having non-inverting inputs 96-2, 97-2, 98-2, and 99-2 respectively connected to the lines 46-1, 46-2, 46-14 and 46-15 respectively. The comparators 96, 97, 98 and 99 also have inverting inputs 96-1, 97-1, 98-1 and 99-1 respectively connected to the line 43. The comparators for the decades thirty through one hundred thirty have not been shown to simplify the schematic. The comparator 96 has a pair of power supply inputs 96-4 and 96-5 connected to the positive potential power supply and the circuit ground potential respectively. Although not shown, all other comparators in the circuit 44 are similarly connected to the power supply. When the input signal voltage level on the line 43 is below the reference voltage level on the line 46-1, the comparator 96 generates a signal at an output 96-3 at or near the positive potential representing the absence of the ten decade enable signal. When the input signal voltage level equals or exceeds the reference voltage level, the comparator 96 generates an output signal at or near the circuit ground potential which represents the ten decade enable signal. As the voltage level of the input signal increases, the other comparators are triggered to generate the associated decade enable signals such that decade enable signals are being generated from the highest voltage level comparator triggered in the circuit 44 and all comparators at voltage levels therebelow. The output 96-3 of the comparator 96 is connected to a line 51-1 which is one of the decade enable signal lines 51 connected to the LED array 52. Similarly, the comparators 97, 98 and 99 have outputs 97-3, 98-3 and 99-3 connected to lines 51-2, 51-14 and 51-15 with lines 51-3 through 51-13 not shown to simplify the schematic.

The line 46-1 is also connected to a non-inverting input 101-2 of a differential comparator 101 having an inverting input 101-1 connected to the line 49 from the strobe circuit 42 to receive the units signal. If the voltage level of the units signal is below the reference voltage level on the line 46-1, the comparator 101 generates a signal at or near the positive potential at an output 101-3 representing the absence of the one units enable signal. When the units signal voltage level equals or exceeds the reference voltage level, the comparator 101 generates an output signal at or near the circuit ground potential which represents the one units enable signal. The output 101-3 is connected to a line 51-16 which is one of the lines 51 connecting the circuit 44 with the LED array 52. The line 46-2 is connected to a non-inverting input 102-2 of a comparator 102 having an inverting input 102-1 connected to the line 49. The comparator 102 also has an output 102-3 connected to a line 51-17 for generating the two units enable signal. The comparators and the enable signal lines 51-18 through 51-24 for the three through nine units enable signals are not shown in order to simplify the schematic diagram.

A comparator 103 has an inverting input 103-1 connected to the line 43 and a non-inverting input 103-2 connected to the circuit ground potential. When the voltage level of the input signal on the line 43 equals or exceeds the circuit ground potential, the comparator 103 generates an output signal at or near the circuit ground potential at an output 103-3 representing the zero decade enable signal. The output 103-3 is connected to a line 51-25.

A comparator 104 has an inverting input 104-1 connected to the circuit ground potential, a non-inverting input 104-2 connected to the line 36 and an output 104-3 connected to a line 51-26 and the line 48. A comparator 105 has an inverting input 105-1 connected to the line 36, a non-inverting input 105-2 connected to the circuit ground potential and an output 105-3 connected to a line 51-27 and to the line 47. If the polarity control signal on the line 36 has a positive polarity, the comparator 104 will generate an output signal at or near the positive potential to represent the absence of a negative polarity enable signal on the lines 48 and 51-26 and to maintain off the FET 74. At the same time, the comparator 105 will generate an output signal at or near the circuit ground potential representing the positive polarity enable signal on the line 51-27 and on the line 47 to turn on the FET 72. If the polarity control signal on the line 36 has a negative polarity, the comparator 104 will generate an output signal at or near the circuit ground potential representing the negative polarity enable signal on the line 51-26 and on the line 48 to turn on the FET 74. At the same time, the comparator 105 will generate an output signal at or near the positive potential to represent the absence of a positive polarity enable signal on the lines 47 and 51-27 to maintain off the FET 72.

Thus, the voltage comparators circuit 44 generates enable signals at or near the circuit ground potential to the LED array 52 on the lines 51. The ten through one hundred fifty decade enable signals are generated on the lines 51-1 through 51-15, the one through nine units enable signals are generated on the lines 51-16 through 51-24, the zero decade enable signal is generated on the line 51-25, the negative polarity enable signal is generated on the line 51-26 and the positive polarity enable signal is generated on the line 51-27.

The LED array 52 includes the LEDs 12 through 20 shown in FIG. 1 with the remainder of the array not shown to simplify the schematic. The LED 12 has a cathode connected to the line 51-25 and an anode connected through a resistor 106 to a low positive potential power supply (not shown) which is typically five volts. If the zero decade enable signal is not being generated, the LED 12 is turned off. If the zero decade enable signal is being generated, the LED 12 is turned on to indicate the voltage level of the input signal equals or exceeds the circuit ground potential. The LEDs 13 through 20 are connected and function in a similar manner.

A line 53-1 is connected to the cathode of the LED 13 and through a resistor 107 to the positive potential power supply. When the ten decade enable signal is not being generated, the line 53-1 is maintained at the positive potential through the resistor 107 and current flows on the line 53-1 to the retrace staircase feedback circuit 54. Each of the decades from ten through one hundred fifty is associated with one of the lines 53-1 through 53-15 with the lines 53-3 through 53-13 not being shown to simplify the schematic. The total current flowing to the circuit 54 is proportional to the number of decade enable signals not being generated and inversely proportional to the number of decade enable signal being generated.

The lines 53-1 through 53-15 are connected through current limiting resistors to a summing point 108 in the circuit 54. For example, the line 53-1 is connected to the summing point 108 through a resistor 109. The summing point 108 is connected to the line 55 to generate the summed positive potential currents to the strobe circuit 42. The line 55 is connected to a summing point 111 which in turn is connected to the negative potential power supply through a series connected resistor 112 and potentiometer 113. The tap of the potentiometer 113 is adjusted to generate a negative potential current which equals the positive potential current from the circuit 54 when the input signal on the line 31 is at the zero voltage level.

The summing point 111 is connected through a resistor 114 to an inverting input 115-1 of an operational amplifier 115. The line 41 from the voltage follower 39 is connected through a resistor 116 to the input 115-1 such that the absolute value input signal and the signal at the summing point 111 are summed at the input 115-1. The amplifier 115 has a non-inverting input 115-2 connected to the circuit ground potential and an output 115-3 connected to the input 115-1 through a parallel connected feedback resistor 117 and a filter capacitor 118. The output signal generated by the amplifier 115 is proportional to the amount by which the absolute value input signal exceeds the voltage level of the highest decade for which a decade enable signal is being generated.

The output 115-3 of the amplifier 115 is connected through a series connected resistor 119 and potentiometer 121 to an inverting input 122-1 of an operational amplifier 122. The amplifier 122 has a non-inverting input 122-2 connected to the circuit ground potential and an output 122-3 connected to the input 122-1 through a parallel connected feedback resistor 123 and filter capacitor 124. The tap on the potentiometer 121 is adjusted for setting the gain of the amplifier 122 to scale the units signal for comparison with the reference voltage levels. The output 122-3 is connected through a current limiting resistor 125 to the line 49 to generate the units signal to the voltage comparators circuit 44. A diode 126 has an anode connected to the circuit ground potential and a cathode connected to the line 49 to clamp at one diode drop below ground potential.

In the preferred embodiment, the operational amplifiers such as the operational amplifiers 64 can be model LM 348 amplifiers manufactured by the National Semiconductor Corp. of Santa Clara, Calif. The differential comparators such as the differential comparator 96 can be model LM 339 comparators manufactured by Texas Instruments, Inc. of Houston, Tex. The FETs 72 and 74 can be 2N4360 field effect transistors manufactured by the National Semiconductor Corp.

In summary, the present invention concerns an apparatus for indicating a quantity of information represented by an input signal having a voltage level proportional to the quantity. The apparatus comprises means for generating a plurality of reference voltage levels typically decimally related to a standard voltage level; means responsive to the input signal and said reference voltage levels for generating a separate first or decade enable signal for each of said reference voltage levels which are equal to or less than the input signal voltage level; and display means including a first plurality of individual indicating means each responsive to one of said first enable signals for generating a visual indication, said first plurality of indicating means positioned along an arc of a circular path in accordance with ascending values of the associated reference voltage levels. The apparatus further includes means responsive to the input signal for generating a units signal having a voltage level proportional to the difference between the input signal voltage level and the voltage level of the largest one of said reference voltage levels for which one of said first enable signals has been generated; means responsive to said units signal voltage level and said reference voltage levels for generating a separate second or units enable signal for each of said reference voltage levels which are equal to or less than said units signal voltage; and a second plurality of individual indicating means each responsive to one of said second enable signals for generating a visual indication, said second plurality of indicating means positioned along a straight line path in accordance with ascending values of the associated reference voltage levels.

In accordance with the provisions of the patent statutes, the principle and mode of operation of the invention have been explained and illustrated in its preferred embodiment. However, it must be understood that the invention may be practiced otherwise than as specifically illustrated and described without departing from its spirit or scope. For example, two or more input signals can be applied to the apparatus in multiplexed form with a resultant multiplexed display. Furthermore, the indicating means can be duplicated with switching of two input signals and the enable signals to the indicating means synchronized for a side-by-side display of two quantities.

What is claimed is:

1. An apparatus for indicating a quantity of information represented by an input signal having a voltage level proportional to the quantity, the apparatus comprising:

means for generating a plurality of reference voltage levels;

means responsive to the input signal and said reference voltage levels for generating a separate first enable signal for each of said reference voltage levels which are equal to or less than the input signal voltage level;

means responsive to the input signal for generating a units signal having a voltage level proportional to the difference between the input signal voltage level and the voltage level of the largest one of said reference voltage levels for which one of said first enable signals has been generated;

means responsive to said units signal voltage level and said reference voltage levels for generating a separate second enable signal for each of said reference voltage levels which are equal to or less than said units signal voltage level; and display means including a first plurality of individual indicating means each responsive to one of said first enable signals for generating a visual indication, said first plurality of indicating means positioned along an arc of a circular path in accordance with ascending values of the associated reference voltage levels, said display means including a second plurality of individual indicating means each responsive to one of said second enable signals for generating a visual indication, said second plurality of indicating means positioned along a straight line path in accordance with ascending values of the associated reference voltage levels.

2. An apparatus according to claim 1 wherein said reference voltage levels are decimally related to a standard reference voltage.

3. An apparatus according to claim 1 wherein said reference voltage levels are decimally related to a standard reference voltage whereby said first plurality of indicating means represent decades of said input signal and said second plurality of indicating means represent units of said input signal.

4. An apparatus for indicating in decimal notation a quantity of electrical information represented by an input signal having a voltage level proportional to the quantity, the apparatus comprising:

means for generating a plurality of decimally related reference voltage levels;

means responsive to the input signal and said reference voltage levels for generating a separate decade enable signal for each of said reference voltage levels which are equal to or less than the input signal voltage level;

means responsive to the input signal for generating a units signal having a voltage level proportional to the difference between the input signal voltage level and the voltage level of the largest one of said reference voltage levels for which one of said enable signals has been generated;

means responsive to said units signal voltage level and said reference voltage levels for generating a separate units enable signal for each of said reference voltage levels which are equal to or less than said units signal voltage level; and display means responsive to said decade enable signals and said units enable signals for indicating in decimal notation the quantity represented by the input signal.

5. An apparatus according to claim 4 wherein said display means includes a plurality of light emitting diodes each responsive to a separate one of said decade and units enable signals for generating a visual indication of the quantity.

6. An apparatus according to claim 4 wherein said display means includes a plurality of decade indicators positioned along an arc of a circular path, each of said decade indicators being responsive to a separate one of said decade enable signals for generating a visual indication of the quantity.

7. An apparatus according to claim 6 wherein said display means includes a plurality of units indicators positioned along a straight line path, each of said units indicators being responsive to a separate one of said units enable signals for generating a visual indication of the quantity.

8. An apparatus according to claim 4 wherein said decade enable signals generating means includes a plurality of differential voltage comparators each responsive to the input signal voltage level and one of said plurality of reference voltage levels for generating one of said separate decade enable signals.

9. An apparatus according to claim 4 wherein said units signal generating means includes a source of a positive potential signal representing the decade enable signals being generated, a source of a negative potential signal and means for summing said positive potential signal, said negative potential signal and the input signal to generate said units signal.

10. An apparatus according to claim 9 wherein said positive potential signal source includes a retrace staircase feedback circuit responsive to said decade enable signals for generating said positive potential signal with a magnitude inversely proportional to the number of decade enable signals being generated.

11. An apparatus according to claim 4 wherein said units enable signals generating means includes a plurality of differential voltage comparators each responsive to said units signal voltage level and one of said plurality of reference voltage levels for generating one of said separate units enable signals.

12. An apparatus for generating a plurality of decimally related enable signals for controlling a load in response to the voltage level of an input signal, the apparatus comprising:

means for generating a plurality of decimally related reference voltage levels;

means responsive to the input signal and said reference voltage levels for generating a separate decade enable signal for each of said reference voltage levels which are equal to or less than the input signal voltage level;

means responsive to the input signal for generating a units signal having a voltage level proportional to the difference between the input signal voltage level and the voltage level of the largest one of said reference voltage levels of which one of said enable signals has been generated; and means responsive to said units signal voltage level and said reference voltage levels for generating a separate units enable signal for each of said reference voltage levels which are equal to or less than said units signal voltage level, wherein said decade enable signals and said units enable signals are the plurality of decimally related enable signals.

13. An apparatus according to claim 12 wherein the load includes means responsive to said decade enable signals and said units enable signals for displaying the voltage level of the input signal.

14. An apparatus according to claim 12 including display means responsive to said decade enable signals and said units enable signals for indicating in decimal notation the voltage level of the input signal.

15. An apparatus according to claim 12 including means responsive to the input signal for generating a signal representing the polarity of the input signal.

16. An apparatus according to claim 15 including means responsive to said polarity signal for indicating the polarity of the input signal.

* * * * *